United States Patent
Chiang et al.

(10) Patent No.: US 9,813,057 B2
(45) Date of Patent: Nov. 7, 2017

(54) SAMPLING CIRCUIT AND SAMPLING METHOD

(71) Applicant: REALTEK SEMICONDUCTOR CORPORATION, Hsinchu (TW)

(72) Inventors: Ming-Cheng Chiang, Hsinchu (TW); Li-Lung Kao, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/446,652

(22) Filed: Mar. 1, 2017

(65) Prior Publication Data
US 2017/0179949 A1 Jun. 22, 2017

Related U.S. Application Data

(62) Division of application No. 14/957,327, filed on Dec. 2, 2015, now Pat. No. 9,621,157.

(51) Int. Cl.
*H03K 17/687* (2006.01)
(52) U.S. Cl.
CPC .................... *H03K 17/6872* (2013.01)
(58) Field of Classification Search
CPC ................................. H03K 17/6872
USPC .......... 327/434, 427, 437, 94, 333, 390, 589
See application file for complete search history.

(56) References Cited

U.S. PATENT DOCUMENTS

| | | | | |
|---|---|---|---|---|
| 6,060,937 A | * | 5/2000 | Singer | H03K 19/01735 327/390 |
| 6,255,865 B1 | * | 7/2001 | Opris | A63F 3/081 327/91 |
| 8,183,890 B1 | * | 5/2012 | Oo | G11C 27/02 327/427 |
| 8,710,896 B2 | | 4/2014 | Allen et al. | |
| 2013/0033302 A1 | * | 2/2013 | Ali | H03K 17/00 327/437 |
| 2015/0188533 A1 | * | 7/2015 | Viswanath | H03K 17/063 378/9 |
| 2015/0188536 A1 | * | 7/2015 | Tang | H03K 17/687 327/390 |

OTHER PUBLICATIONS

M. Dessouky et al., Input switch configuration suitable for rail-to-rail operation of switched opamp circuits, Electronics Letters, Jan. 7, 1999, pp. 8-10, vol. 35.

* cited by examiner

*Primary Examiner* — Lincoln Donovan
*Assistant Examiner* — Thomas Skibinski
(74) *Attorney, Agent, or Firm* — WPAT, P.C., Intellectual Property Attorneys; Anthony King

(57) ABSTRACT

A sampling circuit for sampling an input voltage and generating an output voltage, comprising six switches, a capacitor and a voltage buffer. The first switch has a control terminal and makes the output voltage equal to the input voltage when switching on. The second switch is coupled to a first terminal of the capacitor and a first level. The third switch is coupled to a second terminal of the capacitor and a second level. The fourth switch is coupled to the first terminal of the capacitor and the control terminal. The fifth switch is coupled to the control terminal and the second level. The voltage buffer has large input impedance, and has an input receiving the input voltage, an output providing a voltage equal or close to the input voltage. The sixth switch is coupled to the second terminal of the capacitor and the output of the voltage buffer.

13 Claims, 10 Drawing Sheets

SAMPLING CIRCUIT AND SAMPLING METHOD

BACKGROUND OF THE INVENTION

1. Field of the Invention

The present invention relates to a sampling circuit and the associated sampling method, especially to a sampling circuit and the associated sampling method that improves a sampling accuracy and reduces a slew time of a sampling signal.

2. Description of Related Art

FIG. 1 illustrate a circuit of a conventional bootstrapped switch, which is a common switching and sampling circuit. A reference "Input switch configuration suitable for rail-to-rail operation of switched opamp circuits" from IEE Electronics Letters (1999/01, pp. 8-9) has conducted a research on this circuit. The bootstrapped switch 100 includes switches 110, 120, 130, 140 and 150, an NMOS 160 and a capacitor 170. An input, a node receiving the input voltage VI, and an output, a node outputting the output voltage VO, of the bootstrapped switch 100 are respectively coupled to a source and a drain of the NMOS 160. A gate of the NMOS 160 is coupled to a voltage source V3 through the switch 150 as well as coupled to the capacitor 170 and one terminal of the switch 110 through the switch 140. The other terminal of the switch 110 is coupled to a voltage source V1. The other terminal of the capacitor 170 is coupled to a voltage source V2 through the switch 120 as well as coupled to the source of the NMOS 160 and the input of the bootstrapped switch 100 through the switch 130. The voltage source V1 is of a high voltage level VDD while the voltage sources V2 and V3 are coupled to the ground. Basically, the operation of the bootstrapped switch 100 can be divided into two phases. In the first phase when the switch 110, the switch 120 and the switch 150 switch on while the switch 130 and the switch 140 switch off, the capacitor 170 is gradually charged to VDD and the NMOS 160 is off because the gate thereof is coupled to the ground. In the second phase when the switch 110, the switch 120 and the switch 150 switch off while the switch 130 and the switch 140 switch on, a gate voltage of the NMOS 160 is equal to the input voltage VI plus a voltage drop across the capacitor 170. A formula of an on resistance Ron of a MOSFET can be expressed as:

$$R_{on} = \frac{1}{(V_{GS} - V_{th})\mu_n C_{OX} \frac{W}{L}} \quad (1)$$

Thus, the on resistance Ron of the NMOS 160 in the second phase can be expressed as:

$$R_{on} = \frac{1}{(VDD + VI - VI - V_{th})\mu_n C_{OX} \frac{W}{L}} = \frac{1}{(VDD - V_{th})\mu_n C_{OX} \frac{W}{L}} \quad (2)$$

Notice that the on resistance Ron does not vary with the input voltage VI, and therefore a sampling linearity of the bootstrapped switch 100 can be improved.

The on resistance of the NMOS 160 is independent of the input voltage VI because the conventional bootstrapped switch 100 makes the gate voltage of the NMOS 160 in an on state related to the input voltage VI by having the capacitor 170 coupled between the gate and the source of the NMOS 160 and pre-charged to VDD before the NMOS 160 is turned on by the gate voltage VDD. Unfortunately, the capacitor 170 also increases a capacitive load of the bootstrapped switch 100. It is even worse that when multiple bootstrapped switches 100 are connected in parallel in a multi-bit application circuit, a front-stage circuit thereof encounters even greater capacitive load, which influences stability of an output voltage of the front-stage (i.e., the input voltage VI of the bootstrapped switch 100), resulting in, for example, a degraded phase margin or a reduced bandwidth, which in turn influences a sampling accuracy of the bootstrapped switch 100. Moreover, the increased capacitive load also causes a slew time required by the sampling signal of the bootstrapped switch 100 to increase, degrading the sampling linearity of the bootstrapped switch 100.

SUMMARY OF THE INVENTION

In view of the problems of the prior art, an object of the present invention is to provide a sampling circuit and a sampling method that improve the sampling accuracy and the sampling linearity, so as to make an improvement to the prior art.

The present invention discloses a sampling circuit for sampling an input voltage and generating an output voltage, comprising: a switch, a capacitor, a first switch group, a second switch group, and a voltage buffer. The switch has a control terminal, and switches off in a first switching state and switches on to make the output voltage equal to the input voltage in a second switching state. The capacitor is coupled to the switch. The first switch group is coupled to the capacitor. The second switch group is coupled to the capacitor. The voltage buffer, which is coupled to the switch, the capacitor, the first switch group and the second switch group, has large input impedance. An input of the voltage buffer receives the input voltage and an output of the voltage buffer provides a voltage which is equal or close to the input voltage. In the first switching state when the first switch group switches on and the second switch group switches off, the capacitor is charged to generate a voltage difference across the two terminals thereof, and in the second switching state when the first switch group switches off and the second switch group switches on, the input voltage is coupled to the control terminal of the switch through the voltage buffer and the capacitor so that a voltage at the control terminal is substantially equal or close to the input voltage plus the voltage difference across the capacitor.

The present invention also discloses a sampling method for sampling an input voltage and generating an output voltage. The method comprises the following steps: providing a switch, which has a control terminal and makes the output voltage equal to the input voltage in a switching on state; providing a capacitor, which is coupled to the switch; providing a first switch group, which is coupled to the capacitor; providing a second switch group, which is coupled to the capacitor; providing a voltage buffer, which is coupled to the switch, the capacitor, the first switch group and the second switch group, and has large input impedance and has an input receiving the input voltage and an output providing a voltage equal or close to the input voltage; controlling the first switch group to switch on and the second switch group to switch off in a first switching state in order that the capacitor is charged to generate a voltage difference across the two terminals thereof; controlling the first switch group to switch off and the second switch group to switch on in a second switching state in order that the input voltage is coupled to the control terminal of the switch through the voltage buffer and the capacitor so a voltage at the control terminal is substantially equal or close to the input voltage plus the voltage difference across the capacitor.

The present invention further discloses a sampling circuit for sampling an input voltage and generating an output voltage, comprising a first switch, a capacitor, a second switch, a third switch, a fourth switch, a fifth switch, a voltage buffer and a sixth switch. The first switch has a control terminal and makes the output voltage equal to the input voltage in a switching on state. The capacitor has a first terminal and a second terminal. The second switch is coupled to the first terminal of the capacitor and a first reference voltage level. The third switch is coupled to the second terminal of the capacitor and a second reference voltage level. The fourth switch is coupled to the first terminal of the capacitor and the control terminal. The fifth switch is coupled to the control terminal and the second reference voltage level. The voltage buffer has large input impedance, and has an input receiving the input voltage, an output providing a voltage equal or close to the input voltage. The sixth switch is coupled to the second terminal of the capacitor and the output of the voltage buffer.

The sampling circuit and the sampling method of this invention encounter less capacitive load at an input of the sampling circuit as compared to the prior art; hence, the sampling circuit and the sampling method of this invention can reduce the slew time of the sampling signal to improve the sampling accuracy and the sampling linearity.

These and other objectives of the present invention no doubt becomes obvious to those of ordinary skill in the art after reading the following detailed description of the preferred embodiments that are illustrated in the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
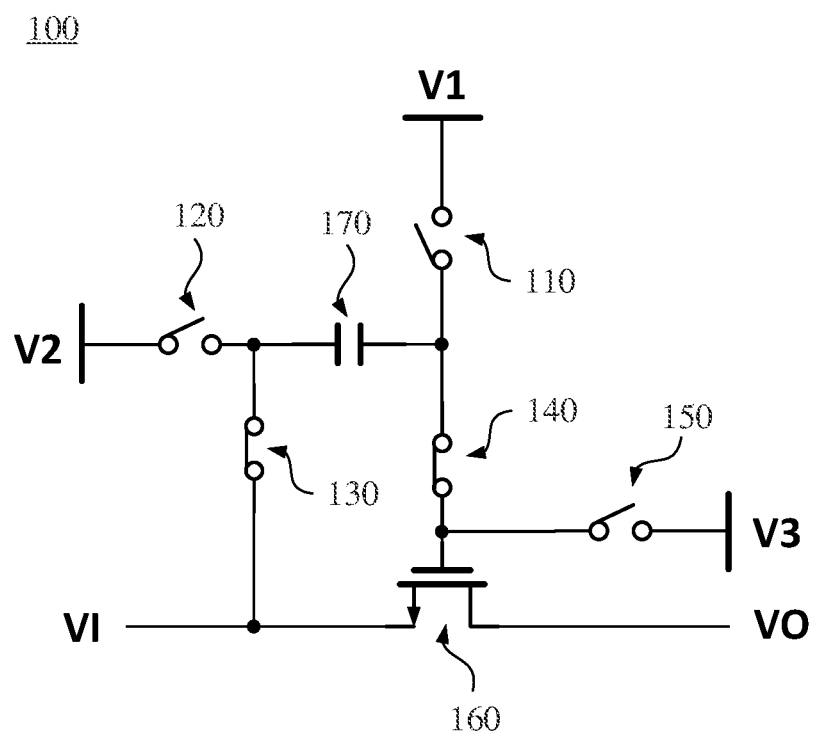
FIG. 1 illustrates a circuit of a conventional bootstrapped switch.
Figure 2:
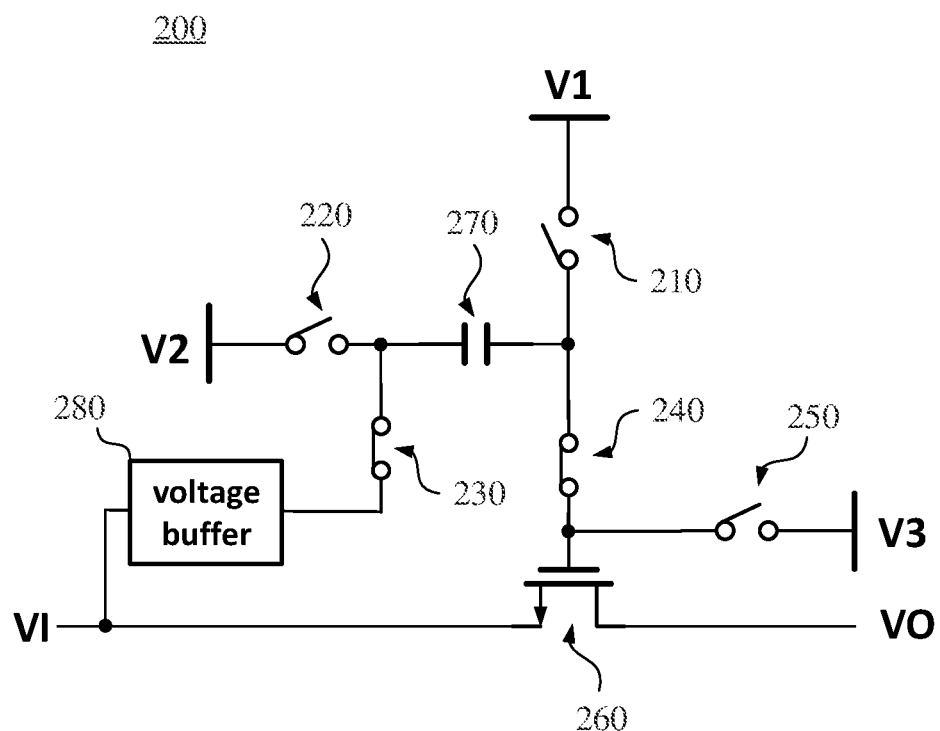
FIG. 2 illustrates a sampling circuit according to an embodiment of the present invention.

FIG. 2 illustrates a sampling circuit according to an embodiment of the present invention. A sampling circuit 200 includes switches 210, 220, 230, 240 and 250, an NMOS 260, a capacitor 270 and a voltage buffer 280. The NMOS 260 is used as a switch. In the IC (integrated circuit) design, a switch can be implemented by a PMOS as well with correspondingly adjusted polarities and bias, the operation principles of which can be understood by people having ordinary skill in the art and are therefore omitted for brevity. An input, a node receiving an input voltage VI, and an output, a node outputting an output voltage VO, of the sampling circuit 200 are respectively coupled to a source and a drain of the NMOS 260. A gate of the NMOS 260 is coupled to a voltage source V3 through the switch 250 as well as coupled to one terminal of the capacitor 270 and one terminal of the switch 210 through the switch 240. The other terminal of the switch 210 is coupled to the voltage source V1. The other terminal of the capacitor 270 is coupled to a voltage source V2 through the switch 220 as well as coupled to an output of the voltage buffer 280 through the switch 230. An input of the voltage buffer 280 is coupled to the source of the NMOS 260, namely, the input of the sampling circuit 200. The voltage source V1 is of a high voltage level VDD whereas the voltage sources V2 and V3 are coupled to the ground. The switches 210, 220, 230, 240 and 250 can be implemented by a single NMOS, PMOS or CMOS (complementary MOSFET), or a combination thereof. A purpose of using the voltage buffer 280 is to prevent the input of the sampling circuit 200 (i.e., an output of a front-stage circuit) from being affected by the capacitive load, resulting from the capacitor 270, as much as possible; therefore the voltage buffer 280 is to provide extremely large input impedance. Further, an output voltage of the voltage buffer 280 varies with the input voltage thereof, namely, the input voltage VI of the sampling circuit 200, making a gate voltage of the NMOS 260 vary with the input voltage VI; as a result, the on resistance of the NMOS 260 does not vary with the input voltage VI, which ensures good sampling linearity of the sampling circuit 200.

Basically, the operations of the sampling circuit 200 can be divided into 2 phases. In the first phase when the switches 210, 220 and 250, which can be regarded as a switch group, switch on whereas the switches 230 and 240, which can be regarded as another switch group, switch off, the capacitor 270 is gradually charged to VDD and the NMOS 260 is off because its gate is coupled to the ground. In the second phase when the switches 210, 220, and 250 switch off whereas the switches 230 and 240 switch on, the gate voltage of the NMOS 260 is equal to the output voltage of the voltage buffer 280 plus the voltage drop across the capacitor 270, which is ideally equal to VDD. Because the output voltage of the voltage buffer 280 varies with its input voltage, namely the input voltage VI of the sampling circuit 200, the on resistance of the NMOS 260 does not vary with the input voltage VI. Therefore, the sampling circuit 200 of this invention retains good sampling linearity in comparison with the bootstrapped switch 100.

Figure 3:
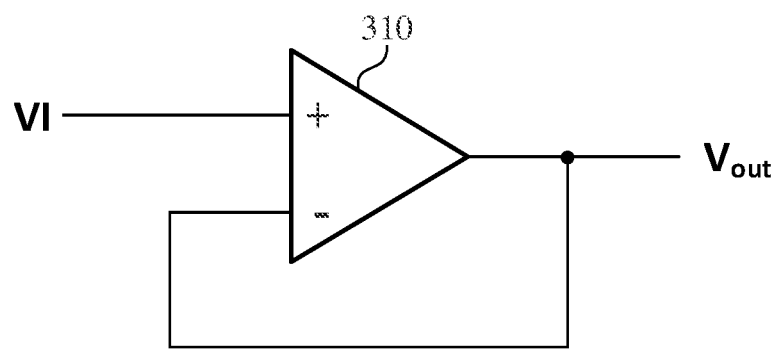
FIG. 3 illustrates a circuit of the voltage buffer 280 according to one embodiment of the present invention.
Figure 4:
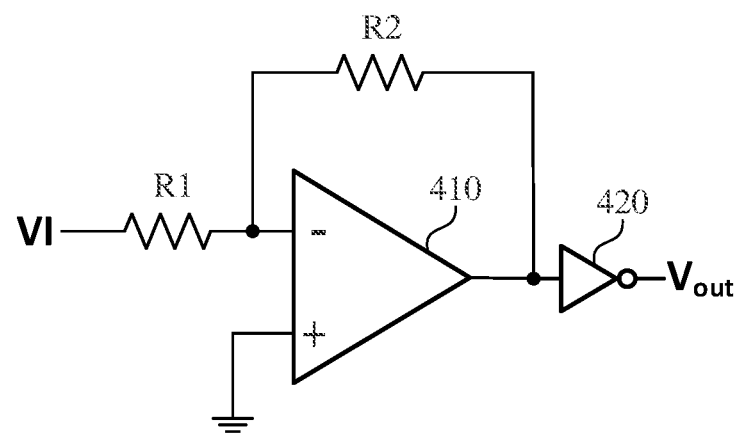
FIG. 4 illustrates a circuit of the voltage buffer 280 according to another embodiment of the present invention.
Figure 5:
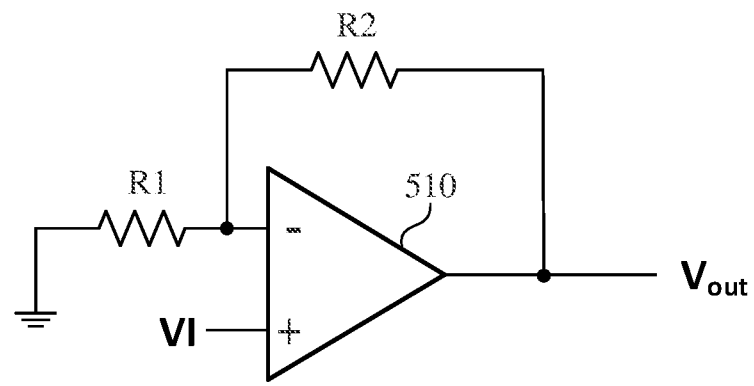
FIG. 5 illustrates a circuit of the voltage buffer 280 according to another embodiment of the present invention.

The voltage buffer 280 can be implemented by an operational amplifier with unity gain, namely, a unity gain buffer, whose circuit is illustrated in FIG. 3. A non-inverting input of the operational amplifier 310 is coupled to receive the input voltage VI whereas an inverting input of the operational amplifier 310 is coupled to the output thereof. An output voltage Vout of the operational amplifier 310 is coupled to the capacitor 270 through the switch 230. In addition to the circuit shown in FIG. 3, the voltage buffer 280 of this invention can also be implemented by an operational amplifier in combination with resistors. As illustrated in FIG. 4, the output of the operational amplifier 410 is coupled to the inverting input through a resistor R2 and the non-inverting input is coupled to the ground. The input voltage VI is input to the inverting input of the operational amplifier 410 through a resistor R1. The voltage at the output of the operational amplifier 410 is −VI when the resistor R1 is equal to the resistor R2. An output voltage Vout is equal to the input voltage VI as the output of the operational amplifier 410 is coupled to an inverter 420. In addition, the voltage buffer 280 can also be implemented by the circuit illustrated in FIG. 5. The output of the operational amplifier 510 is coupled to the inverting input through a resistor R2, and the inverting input is further coupled to the ground through a resistor R1. The non-inverting input of the 510 is to receive the input voltage VI. A ratio of the output voltage Vout to the input voltage VI is (R1+R2)/R1. If the resistance of the resistor R1 is much greater than that of the resistor R2, such as the ratio of the resistance of the resistor R1 to that of the resistor R2 being greater than 100, the output voltage Vout is close to the input voltage VI. The implementation of the voltage buffer 280 is not limited to FIGS. 3~5 and has a variety of modifications with different ways of connections between the operational amplifier and the resistor(s). The reason an operational amplifier is used in the voltage buffer 280 is because an ideal operational amplifier possesses extremely large input impedance, which virtually isolating the output of a front-stage circuit and the capacitor 270. As a result, the front-stage circuit encounters little capacitive load.

Figure 6:
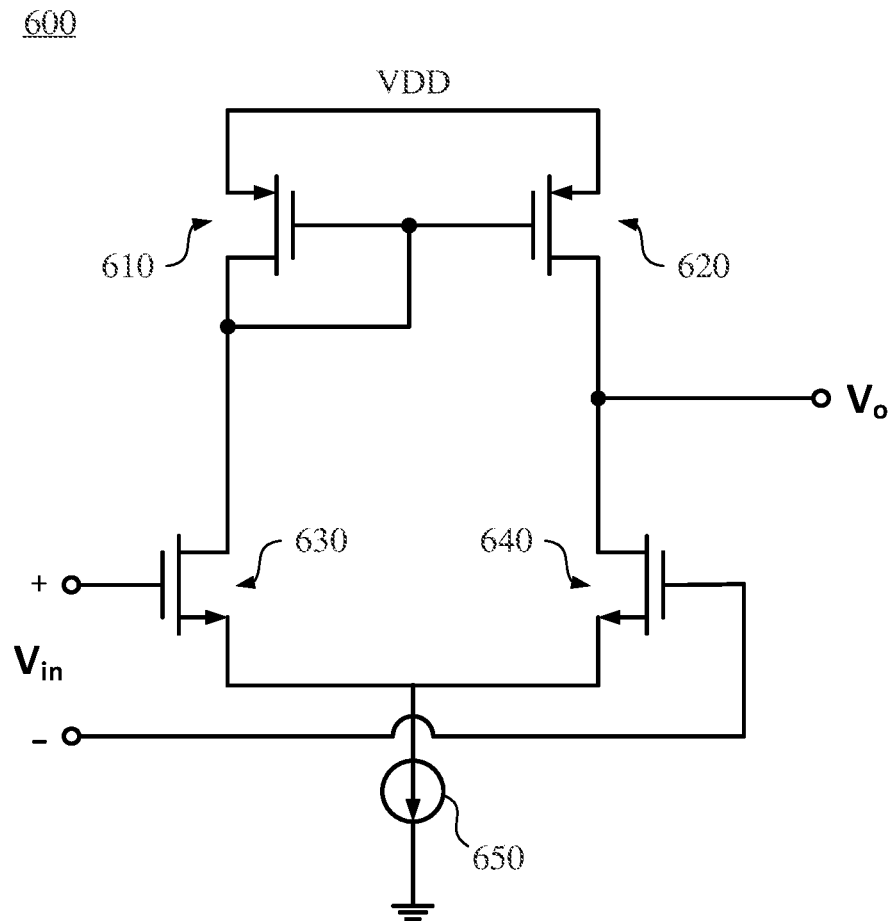
FIGS. 6-9 illustrate circuits of an operational amplifier.
Figure 7:
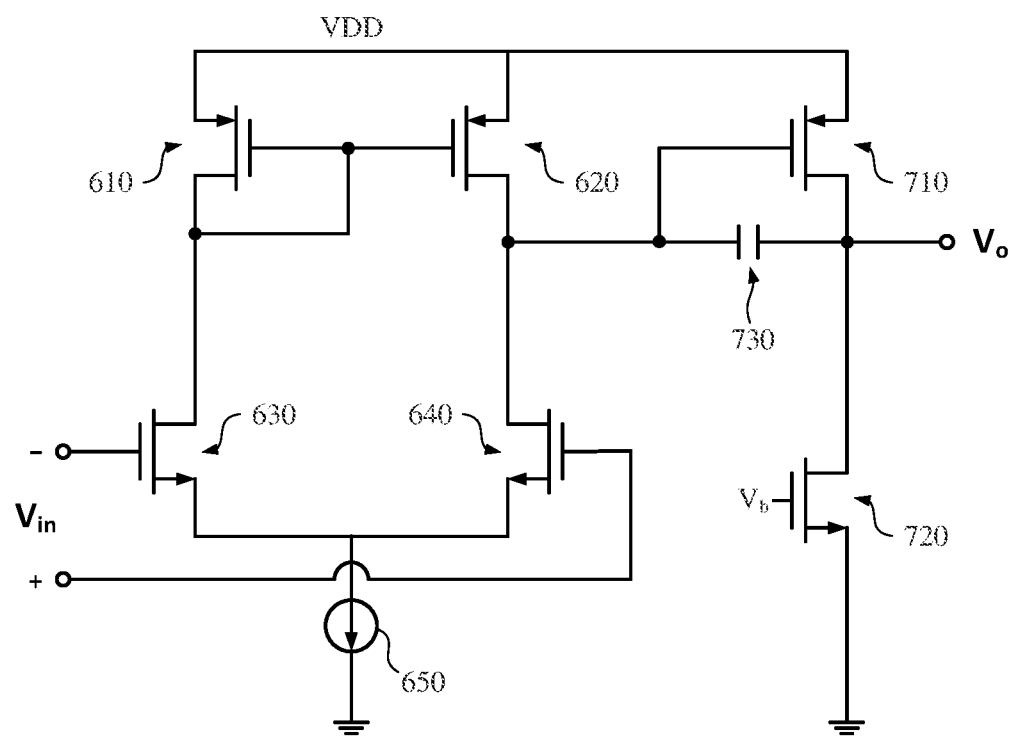

The above-mentioned operational amplifiers 310, 410 and 510 can be implemented by the circuits illustrated in FIGS. 6~9. The operational amplifier 600 shown in FIG. 6 includes 2 PMOSs 610 and 620 and 2 NMOSs 630 and 640. The gates of the PMOS 610 and the PMOS 620 are coupled to each other and further coupled to a drain of the PMOS 610. The sources of the PMOS 610 and the PMOS 620 are both coupled to VDD. The drains of the PMOS 610 and the PMOS 620 are coupled to the drains of the NMOS 630 and the NMOS 640, respectively. The sources of the NMOS 630 and the NMOS 640 are both coupled to a current source 650. The gates of the NMOS 630 and the NMOS 640 serve as the inverting input and the non-inverting input of the operational amplifier, respectively. The output Vo of the operational amplifier is coupled to the drains of the PMOS 620 and the NMOS 640. The operational amplifier 700 in FIG. 7 includes the aforementioned PMOS 610, PMOS 620, NMOS 630, NMOS 640 and current source 650 as well as a PMOS 710 and an NMOS 720, whose drains are coupled to each other. A gate of the PMOS 710 is coupled to the drain of the PMOS 620. The drain of the PMOS 710 serves as the output Vo and is further coupled to the drain of the PMOS 620 through a capacitor 730. A gate of the NMOS 720 is biased by a voltage $V_b$ and a source of the NMOS 720 is coupled to the ground. In contrast to the circuit of FIG. 6, the circuit of FIG. 7 includes a post-stage section, which is made up of the PMOS 710, the NMOS 720 and the capacitor 730, so the PMOS 710 is typically referred to as a two-stage operational amplifier, whereas the circuit of FIG. 6 is referred to as a single-stage operational amplifier.

Figure 8:
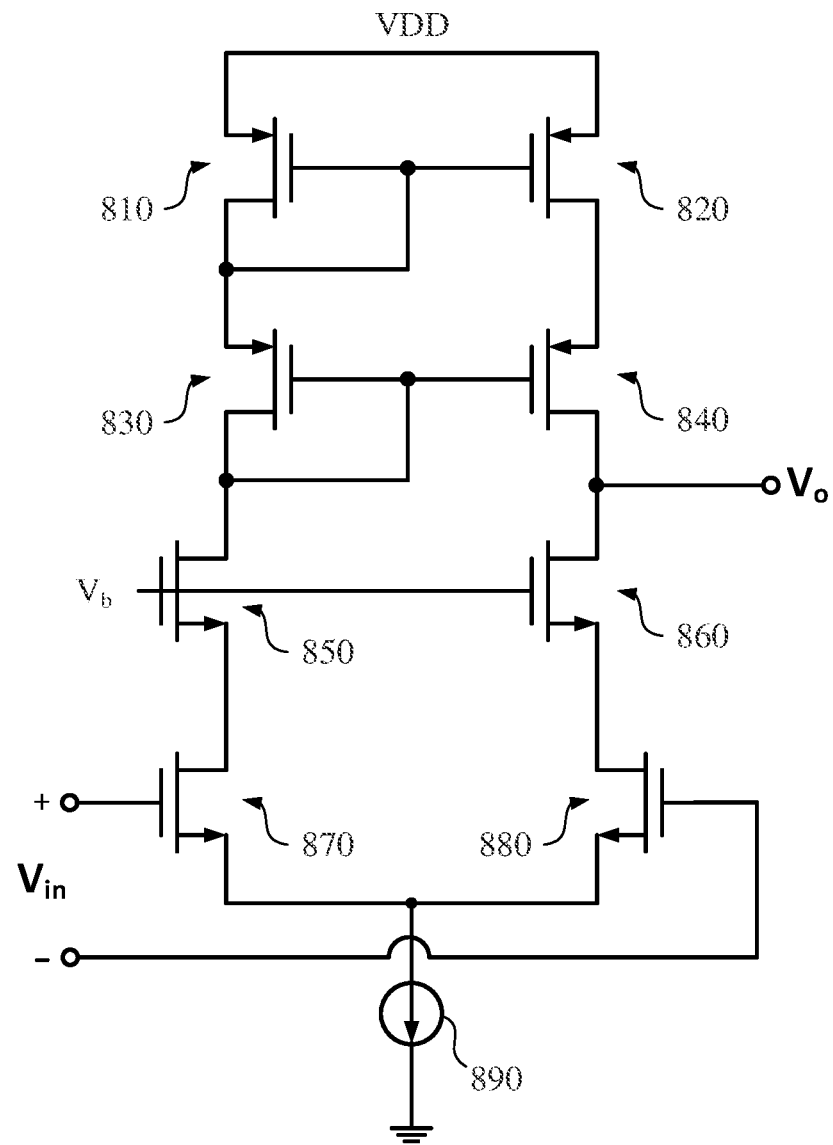
Figure 9:
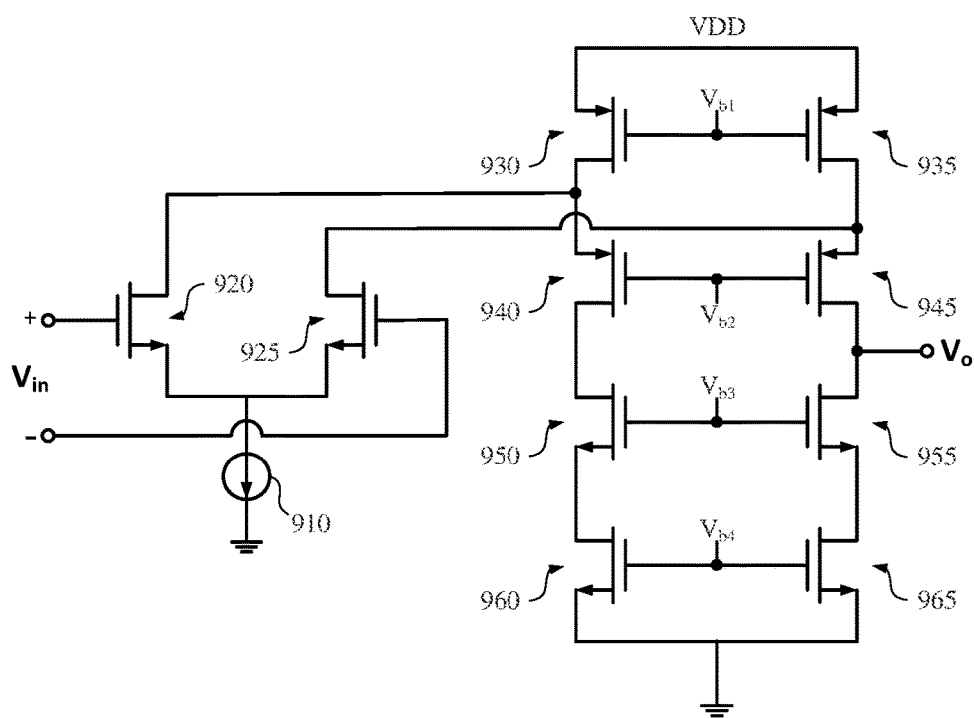

The circuit shown in FIG. 8 includes 4 groups of cascode transistors. The transistor group directly coupled to VDD includes a PMOS 810 and a PMOS 820. The sources of the PMOS 810 and the PMOS 820 are coupled to VDD, their gates are coupled to each other and further coupled to a drain of the PMOS 810, and their drains are coupled to a transistor group made up of the PMOS 830 and the PMOS 840. The sources of the PMOS 830 and the PMOS 840 are respectively coupled to the drains of the PMOS 810 and the PMOS 820, their gates are coupled to each other and further coupled to the drain of the PMOS 830, and their drains are coupled to a transistor group made up of the NMOS 850 and the NMOS 860. The drains of the NMOS 850 and the NMOS 860 are respectively coupled to the drains of the PMOS 830 and the PMOS 840, their gates are biased by the voltage $V_b$, and their sources are coupled to a transistor group made up of the NMOS 870 and the NMOS 880. The drains of the NMOS 870 and the NMOS 880 are respectively coupled to the sources of the NMOS 850 and the NMOS 860, their gates serve as the inputs of the operational amplifier, and their sources are coupled to a current source 890, which is coupled to the ground. The output of the operational amplifier is at the drains of the PMOS 840 and the NMOS 860. The operational amplifier 800 is typically referred to as a telescopic cascode operational amplifier. FIG. 9 illustrates another embodiment of the operational amplifiers 310, 410 and 510. The circuit of FIG. 9 is referred to as a folded cascode operational amplifier. The right half of the operational amplifier 900 includes 4 stacked transistor groups. The 4 transistor groups, from top to bottom, includes a PMOS 930 and a PMOS 935, a PMOS 940 and a PMOS 945, a NMOS 950 and a NMOS 955, as well as a NMOS 960 and a NMOS 965, respectively. The gates of the 4 transistor groups are respectively biased by voltages $V_{b1}$, $V_{b2}$, $V_{b3}$, and $V_{b4}$. The left half of the operational amplifier 900 includes another transistor group made up of an NMOS 920 and an NMOS 925. The drains of the NMOS 920 and the NMOS 925 are respectively coupled to the drain of the PMOS 930 and the drain of the PMOS 935, their sources are both coupled to a current source 910, and their gates serve as the inputs of the operational amplifier 900.

The PMOSs in the operational amplifiers 600, 700, 800 and 900 can be substituted by NMOSs and vice versa, and the same function can be obtained with correspondingly adjusted polarities and biases. Such modifications are well known to people having ordinary skill in the art and therefore are omitted for brevity.

Figure 10:
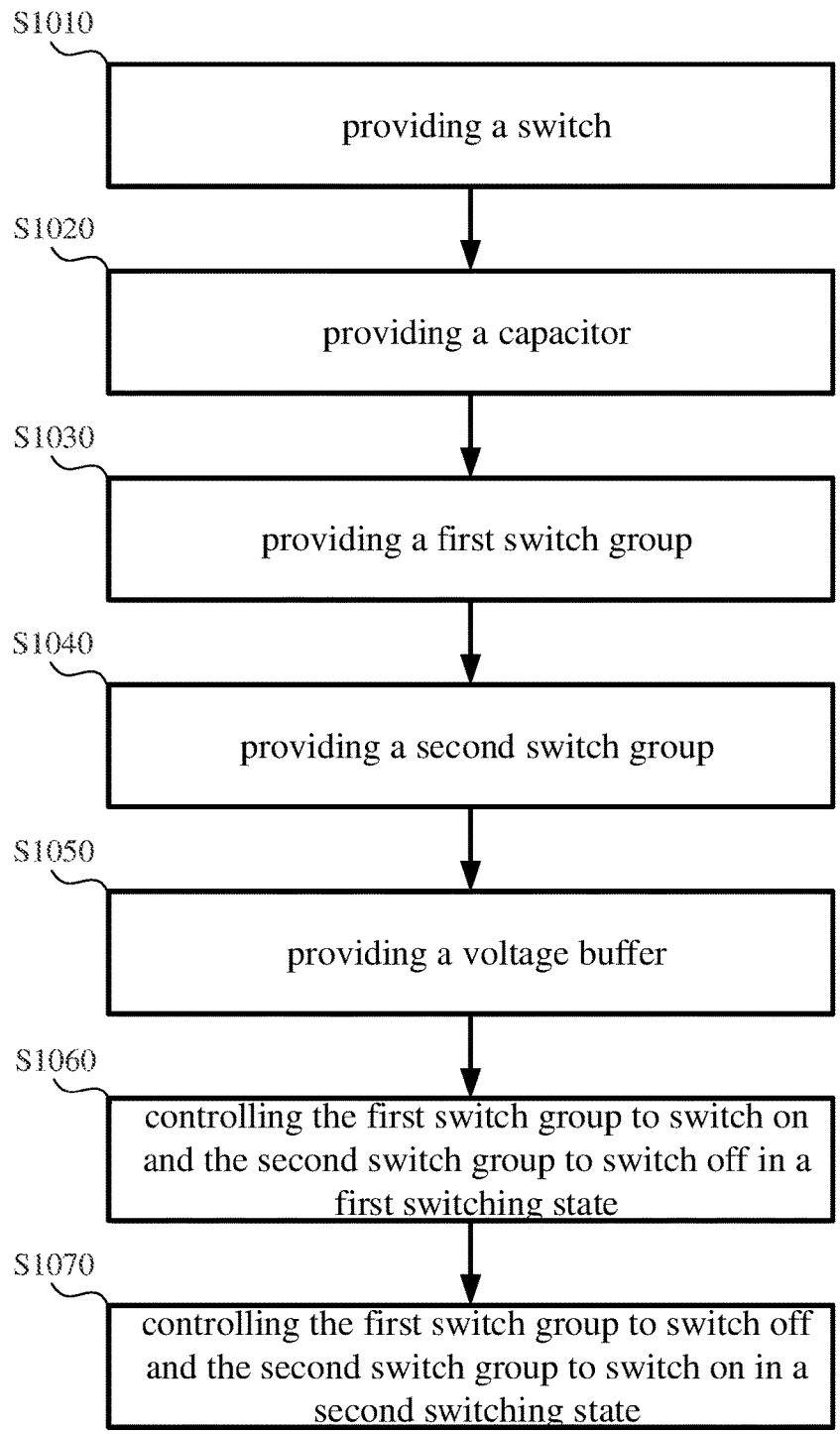
FIG. 10 illustrates a flowchart of a sampling method according to an embodiment of this invention.

FIG. 10 illustrates a flowchart of a sampling method according to an embodiment of this invention. In addition to the sampling circuit 200, this invention also discloses a corresponding sampling method that improves the sampling accuracy and the sampling linearity and reduces the capacitive load encountered by a front-stage circuit. As shown in FIG. 10, an embodiment of the sampling method includes the following steps:

S1010: providing a switch. For example the switch can be the NMOS 260 in FIG. 2, with its gate serving as a control terminal. When the switch in on, the output voltage VO is equal to the input voltage VI;

S1020: providing a capacitor. For example, the capacitor can be the capacitor 270 in FIG. 2;

S1030: providing a first switch group. For example the first switch group includes the switches 210, 220 and 250 in FIG. 2;

S1040: providing a second switch group. For example the second switch group includes the switches 230 and 240 in FIG. 2;

S1050: providing a voltage buffer. The voltage buffer is coupled to the switch, the capacitor, the first switch group and the second switch group. The voltage buffer has large input impedance, and its input is coupled to receive the input voltage VI and its output provides a voltage that is equal or close to the input voltage VI. For example, the voltage buffer can be one of the circuits illustrated in FIGS. 3~5;

S1060: controlling the first switch group to switch on and the second switch group to switch off in a first switching state. In the first switching state, the two terminals of the capacitor are respectively coupled to a first voltage source and a second voltage source, and the capacitor is being charged in the first switching state until a voltage drop across its two terminals is equal to a voltage difference between the first voltage source and the second voltage source. The control terminal of the switch is coupled to the second voltage source to make the switch be switched off so the output voltage VO is not equal to the input voltage VI; and S1070: controlling the first switch group to switch off and the second switch group to switch on in a second switching state. In the second switching state, the input voltage VI is coupled to the control terminal of the switch through the voltage buffer and the capacitor; as a result, a voltage at the control terminal is substantially equal or close to the input voltage VI plus the voltage drop across the capacitor. According to the equation (2), the on resistance of the switch is not influenced by the input voltage VI, and therefore a better sampling linearity can be obtained during sampling.

Since people of ordinary skill in the art can appreciate the implementation detail and the modification thereto of the present method invention of FIG. 10 through the disclosure of the device invention of FIGS. 2~9, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A sampling circuit for sampling an input voltage and generating an output voltage, comprising:
    a switch, switching off in a first switching state and switching on to make the output voltage equal to the input voltage in a second switching state, wherein the switch has a control terminal;
    a capacitor, coupled to the switch;
    a first switch group, coupled to the capacitor;
    a second switch group, coupled to the capacitor; and
    a voltage buffer, coupled to the switch, the capacitor, the first switch group and the second switch group, having large input impedance, wherein an input of the voltage buffer receives the input voltage and an output of the voltage buffer provides a voltage which is equal or close to the input voltage;
    wherein, in the first switching state when the first switch group switches on and the second switch group switches off, the capacitor is charged to generate a voltage difference across the two terminals thereof, and in the second switching state when the first switch group switches off and the second switch group switches on, the input voltage is coupled to the control terminal of the switch through the voltage buffer and the capacitor so that a voltage at the control terminal is substantially equal or close to the input voltage plus the voltage difference across the capacitor.

2. The sampling circuit of claim 1, wherein the voltage buffer is an operational amplifier having an inverting input, a non-inverting input and an output, the non-inverting input is to receive the input voltage, the inverting terminal is coupled to the output of the operational amplifier, and the output of the operational amplifier is coupled to the capacitor.

3. The sampling circuit of claim 1, wherein the voltage buffer comprises:
    an operational amplifier, having an inverting input, a non-inverting input and an output, wherein the non-inverting input receives the input voltage;
    a first resistor, having one terminal coupled to the inverting input and another terminal coupled to the ground; and
    a second resistor, having one terminal coupled to the inverting input and another terminal coupled to the output of the operational amplifier;
    wherein, the resistance of the first resistor is greater than the resistance of the second resistor to make a voltage at the output of the operational amplifier equal or close to the input voltage.

4. The sampling circuit of claim 1, wherein the switch is an NMOS having a source receiving the input voltage, a drain providing the output voltage, and a gate being the control terminal.

5. The sampling circuit of claim 4, wherein the first switch group comprises:
    a first switch, coupled to a first terminal of the capacitor and a first reference voltage level;
    a second switch, coupled to a second terminal of the capacitor and a second reference voltage level; and
    a third switch, coupled to the gate of the NMOS and the second reference voltage level; and
    the second switch group comprises:
    a fourth switch, coupled to the second terminal of the capacitor and the voltage buffer; and
    a fifth switch, coupled to the gate of the NMOS and the first terminal of the capacitor.

6. A sampling method for sampling an input voltage and generating an output voltage, the method comprising:
    providing a switch, which has a control terminal and makes the output voltage equal to the input voltage in a switching on state;
    providing a capacitor, which is coupled to the switch;
    providing a first switch group, which is coupled to the capacitor;
    providing a second switch group, which is coupled to the capacitor;
    providing a voltage buffer, which is coupled to the switch, the capacitor, the first switch group and the second switch group, and has large input impedance and has an input receiving the input voltage and an output providing a voltage equal or close to the input voltage;
    controlling the first switch group to switch on and the second switch group to switch off in a first switching state in order that the capacitor is charged to generate a voltage difference across the two terminals thereof;
    controlling the first switch group to switch off and the second switch group to switch on in a second switching state in order that the input voltage is coupled to the control terminal of the switch through the voltage buffer and the capacitor so a voltage at the control terminal is substantially equal or close to the input voltage plus the voltage difference across the capacitor.

7. The sampling method of claim 6, wherein the voltage buffer is an operational amplifier having an inverting input, a non-inverting input and an output, the non-inverting input is to receive the input voltage, the inverting terminal is coupled to the output of the operational amplifier, and the output of the operational amplifier is coupled to the capacitor.

8. The sampling method of claim 6, wherein the voltage buffer comprises:
   an operational amplifier, having an inverting input, a non-inverting input and an output, wherein the non-inverting input receives the input voltage;
   a first resistor, having one terminal coupled to the inverting input and another terminal coupled to the ground; and
   a second resistor, having one terminal coupled to the inverting input and another terminal coupled to the output of the operational amplifier;
   wherein, the resistance of the first resistor is greater than the resistance of the second resistor to make a voltage at the output of the operational amplifier equal or close to the input voltage.

9. A sampling circuit for sampling an input voltage and generating an output voltage, comprising:
   a first switch, having a control terminal and making the output voltage equal to the input voltage in a switching on state;
   a capacitor, having a first terminal and a second terminal;
   a second switch, coupled to the first terminal of the capacitor and a first reference voltage level;
   a third switch, coupled to the second terminal of the capacitor and a second reference voltage level;
   a fourth switch, coupled to the first terminal of the capacitor and the control terminal;
   a fifth switch, coupled to the control terminal and the second reference voltage level;
   a voltage buffer, having large input impedance and having an input receiving the input voltage, an output providing a voltage equal or close to the input voltage; and
   a sixth switch, coupled to the second terminal of the capacitor and the output of the voltage buffer.

10. The sampling circuit of claim 9, wherein in a first switching state when the first switch, the fourth switch and the sixth switch are off, and the second switch, the third switch and the fifth switch are on, the capacitor is being charged; in a second switching state when the first switch, the fourth switch and the sixth switch are on, and the second switch, the third switch and the fifth switch are off, the input voltage is coupled to the control terminal of the first switch through the voltage buffer and the capacitor so a voltage at the control terminal is substantially equal to the input voltage plus a voltage difference across the two terminals of the capacitor.

11. The sampling circuit of claim 9, wherein the voltage buffer is an operational amplifier having an inverting input, a non-inverting input and an output, the non-inverting input is to receive the input voltage, the inverting terminal is coupled to the output of the operational amplifier, and the output of the operational amplifier is coupled to the capacitor.

12. The sampling circuit of claim 9, wherein the voltage buffer comprises:
   an operational amplifier, having an inverting input, a non-inverting input and an output, wherein the non-inverting input receives the input voltage;
   a first resistor, having one terminal coupled to the inverting input and another terminal coupled to the ground; and
   a second resistor, having one terminal coupled to the inverting input and another terminal coupled to the output of the operational amplifier;
   wherein, the resistance of the first resistor is greater than the resistance of the second resistor to make a voltage at the output of the operational amplifier equal or close to the input voltage.

13. The sampling circuit of claim 9, wherein the switch is an NMOS having a source receiving the input voltage, a drain providing the output voltage, and a gate being the control terminal.

* * * * *